United States Patent
Pao et al.

(10) Patent No.: US 8,547,187 B2
(45) Date of Patent: Oct. 1, 2013

(54) PRINTED CIRCUIT BOARD IMPEDANCE MATCHING STEP FOR MICROWAVE (MILLIMETER WAVE) DEVICES

(75) Inventors: Hsueh-Yuan Pao, San Jose, CA (US); Jerardo Aguirre, San Diego, CA (US); Paul Sargis, Livermore, CA (US)

(73) Assignees: Lawrence Livermore National Security, LLC., Livermore, CA (US); Kyocera America, Inc., San Diego, CA (US)

( * ) Notice: Subject to any disclaimer, the term of this patent is extended or adjusted under 35 U.S.C. 154(b) by 372 days.

(21) Appl. No.: 12/895,347

(22) Filed: Sep. 30, 2010

(65) Prior Publication Data

US 2011/0241794 A1 Oct. 6, 2011

Related U.S. Application Data

(60) Provisional application No. 61/319,975, filed on Apr. 1, 2010.

(51) Int. Cl.
*H01P 5/00* (2006.01)
*H03H 7/38* (2006.01)

(52) U.S. Cl.
USPC ............................. 333/33; 333/238

(58) Field of Classification Search
USPC .................. 333/33, 238, 246, 247
See application file for complete search history.

(56) References Cited

U.S. PATENT DOCUMENTS 5,184,095 A * 2/1993 Hanz et al. ............ 333/33
6,127,977 A * 10/2000 Cohen ............... 343/700 MS

* cited by examiner

*Primary Examiner* — Stephen Jones
(74) *Attorney, Agent, or Firm* — John P. Wooldridge

(57) ABSTRACT

An impedance matching ground plane step, in conjunction with a quarter wave transformer section, in a printed circuit board provides a broadband microwave matching transition from board connectors or other elements that require thin substrates to thick substrate (>quarter wavelength) broadband microwave (millimeter wave) devices. A method of constructing microwave and other high frequency electrical circuits on a substrate of uniform thickness, where the circuit is formed of a plurality of interconnected elements of different impedances that individually require substrates of different thicknesses, by providing a substrate of uniform thickness that is a composite or multilayered substrate; and forming a pattern of intermediate ground planes or impedance matching steps interconnected by vias located under various parts of the circuit where components of different impedances are located so that each part of the circuit has a ground plane substrate thickness that is optimum while the entire circuit is formed on a substrate of uniform thickness.

11 Claims, 8 Drawing Sheets

PRINTED CIRCUIT BOARD IMPEDANCE MATCHING STEP FOR MICROWAVE (MILLIMETER WAVE) DEVICES

CROSS-REFERENCE TO RELATED APPLICATIONS

This application claims priority to U.S. Provisional 61/319,975, titled "Printed Circuit Board Impedance Matching Step For Thick Substrate Broadband Microwave (Millimeter Wave) Devices," filed Apr. 1, 2010, incorporated herein by reference.

GOVERNMENT RIGHTS

The United States Government has rights in this invention pursuant to Contract No. DE-AC52-07NA27344 between the United States Department of Energy and Lawrence Livermore National Security, LLC.

BACKGROUND OF THE INVENTION

1. Field of the Invention

This invention pertains generally to printed circuit board electronic devices, and more particularly to electrical interconnects between board areas, and most particularly to printed circuit board impedance matching for broadband microwave devices.

2. Description of Related Art

High frequency electronic circuits, e.g. microwave circuits, require the propagation of electromagnetic signals along various paths. Various forms of transmission lines and other waveguides are used in these circuits. In a transmission line or waveguide, the electromagnetic field is confined to an area around physical elements along the transmission path (in contrast to antennas where the electromagnetic field is radiated into space).

Transmission lines use a physical configuration of conductors and dielectrics to direct a signal along a desired path. Most transmission lines use two conductors, a signal carrying conductor or trace and a ground conductor or return path.

Common transmission lines include microstrip lines, striplines, and coplanar lines (or waveguides). A microstrip line has a trace separated from a ground plane by a dielectric layer. A stripline has a trace embedded in a dielectric layer which is sandwiched between two ground planes. A coplanar line (or waveguide) has a trace separated from a pair of ground planes, all on the same plane atop a dielectric layer; an additional ground plane may also be added on the opposite side of the dielectric layer.

A microstrip is a particular type of electrical transmission line that is highly preferred for microwave circuits because of its simplicity and ease of fabrication. The microstrip can be fabricated with printed circuit board (PCB) technology. The microstrip is made up of a conducting strip or trace separated from a ground plane by a dielectric layer or substrate. The trace and ground plane are conductors, typically metal. The substrate is made of a dielectric material. An upper dielectric, typically air, surrounds the trace and substrate surface.

The microstrip can be used not just as a transmission line but also to form other circuit elements. Various microwave components, including antennas, couplers, filters, and power dividers, can be formed from a microstrip, as a pattern of metallization on the substrate that produces the entire microwave device (circuit).

Microstrip lines, as well as other transmission lines and other circuit components, have a characteristic impedance. The impedance of a microstrip line is a complex function of its geometry, dimensions, and material properties. The distance between the trace and ground plane affects the impedance.

Impedance matching at the interconnects between circuit components, e.g. between a coaxial cable and an electronic device, is necessary for efficient coupling. By closely matching the output impedance of the cable to the input impedance of the device, electrical signals are transmitted from the cable to the device without substantial reflection.

One particular type of circuit where an electrically seamless connection is difficult is between a broadband microwave (millimeter wave) device, such as a patch antenna, and a coaxial connector/board connection. To achieve broadband performance for the patch antenna, the ground plane beneath the patch antenna must be on a substrate with a thickness that is a sizeable fraction of the wavelength of the desired frequency of operation. However, to energize the antenna by a coaxial cable interconnect, the ground plane for a transmission line connecting the microwave (millimeter wave) device and the connector is only feasible on a substantially thinner substrate. In general circuits are fabricated on substrates (PCBs) of constant thickness.

One common area where this problem exists is in the mobile wireless markets. There a small number of broadband path radiators, necessarily on thick substrates, are interconnected to RF feeding networks requiring thinner substrates for impedance control.

Accordingly it is desirable to provide broadband microwave electrical interconnect between board areas containing different heights in surface-to-ground plane (return path) location.

SUMMARY OF THE INVENTION

The invention is apparatus and method to provide broadband microwave electrical interconnect on a printed circuit board between board areas containing different heights in surface-to-ground plane (return path) location. An impedance matching ground plane step formed in the circuit substrate in conjunction with a quarter wave transformer section in a printed circuit board provides broadband microwave matching transition from a board connector to thick substrate (>quarter wavelength) broadband microwave (millimeter wave) devices.

The invention includes apparatus for making a broad band interconnect from an energizing coaxial cable/connector/board to a microwave device including a ground plane step incorporated in an intervening layer of a multilayer printed circuit board, and vias connecting the ground planes of the ground step.

The invention also includes a microwave or millimeter wave circuit, having a multi-layered dielectric substrate; a conductive trace formed on one surface of the substrate, the trace being patterned to define circuit elements and transmission lines; a base ground plane formed on the opposed surface of the substrate; an intermediate ground plane formed on a layer of the substrate below a circuit element or transmission line; and vias connecting the intermediate ground plane to the base ground plane to from a stepped ground plane structure; wherein the intermediate ground plane is positioned to control the impedance of the overlying circuit element or transmission line.

The invention further includes a method of making a broad band interconnect from an energizing coaxial cable/connector/board to a microwave device by incorporating a ground plane step in an intervening layer of a multilayer printed circuit board, and connecting the ground planes of the ground step.

The invention also includes a method of constructing microwave and other high frequency electrical circuits on a substrate of uniform thickness, where the circuit is formed of a plurality of interconnected elements of different impedances that individually require substrates of different thicknesses, by providing a substrate of uniform thickness that is a composite or multilayered substrate; and forming a pattern of intermediate ground planes or impedance matching steps interconnected by vias located under various parts of the circuit where components of different impedances are located so that each part of the circuit has a ground plane substrate thickness that is optimum while the entire circuit is formed on a substrate of uniform thickness.

Further aspects of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings, which are for illustrative purposes only.

DETAILED DESCRIPTION OF THE INVENTION

Referring more specifically to the drawings, for illustrative purposes the present invention is embodied in the apparatus and method generally shown in FIG. 1 through FIG. 9. It will be appreciated that the apparatus may vary as to configuration and as to details of the parts, and the method may vary as to the specific sequence of its steps, without departing from the basic concepts as disclosed herein.

The technical problem addressed by this invention is an electrically seamless connection between a broadband microwave (millimeter wave) device and a coaxial connector or other board connection. A broadband interconnect between an energizing coaxial cable/connector/board interconnect and a microwave device is achieved by the invention by incorporating a ground plane step in an intervening layer of a multilayer printed circuit board, the ground planes of the step being connected by vias. The interconnect may also include impedance control compensation immediately above the ground step. This compensation is a step change in the width of the interconnect. To achieve broadband performance, different components must be on substrates of different thicknesses to the ground plane. The invention allows the ground plane beneath a microwave device to be on a thicker substrate, e.g. one that is a sizeable fraction of the wavelength of the desired frequency of operation, and the ground plane for a transmission line connecting the microwave (millimeter wave) devices and the connector to be on a substantially thinner substrate.

More generally the invention is directed to constructing high frequency electrical circuits, e.g. microwave circuits, on a substrate of uniform thickness, where the circuit is formed of a plurality of interconnected elements of different impedances that individually require substrates of different thicknesses. It would be cumbersome and impractical to connect various substrates of different thicknesses. The invention provides a substrate of uniform thickness that is a composite or multilayered substrate having a pattern of intermediate ground planes or impedance matching steps interconnected by vias located under various parts of the circuit where components of different impedances are located. Thus each part of the circuit has a ground plane substrate thickness that is optimum while the entire circuit is formed on a PCB of uniform thickness.

Figure 1:
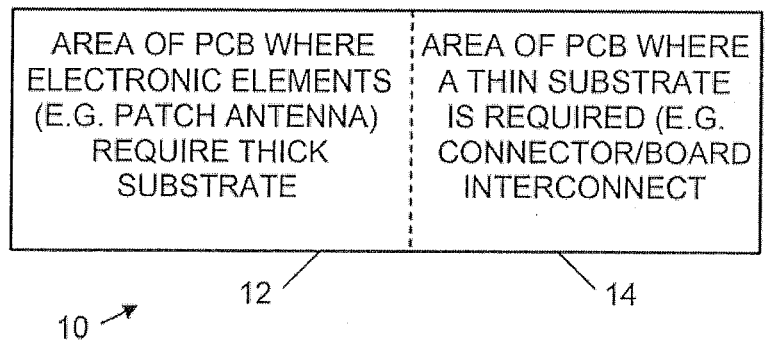
FIG. 1 is a simple block diagram of a printed circuit board having two portions that require different substrate thicknesses and that are interconnected by the invention.

A conceptual block diagram of a printed circuit board (PCB) 10 that is used for circuits addressed by the invention is shown in FIG. 1. PCB 10 generally forms a substrate on which various circuit elements are formed and interconnected. PCB 10 also has a ground plane to serve as a return path for the circuit. PCB 10 is divided into two circuit portions or parts 12, 14 that can be described as having different substrate thicknesses as defined by the first ground plane in the multi-layer PCB 10 that are electrically interconnected in accordance with the invention. For example, portion 12 is an area or region of PCB 10 where electronic elements, e.g. a patch antenna, require a thick substrate, while portion 14 is an area or region of PCB 10 where a thin substrate is required, e.g. a connector. The invention provides broadband electrical interconnection between these two regions 12, 14. While two circuit parts are shown, additional parts of differing substrate thickness may also be present and similarly interconnected.

The broadband electrical connection is produced, as explained further below, by introducing a step connection between two or more ground planes through the use of vias. The step connection is completed by introducing a compensation reactive component (a width change on the interconnect) on the layer above the step(s) for interconnects such as microstrips or striplines.

Figure 2A:
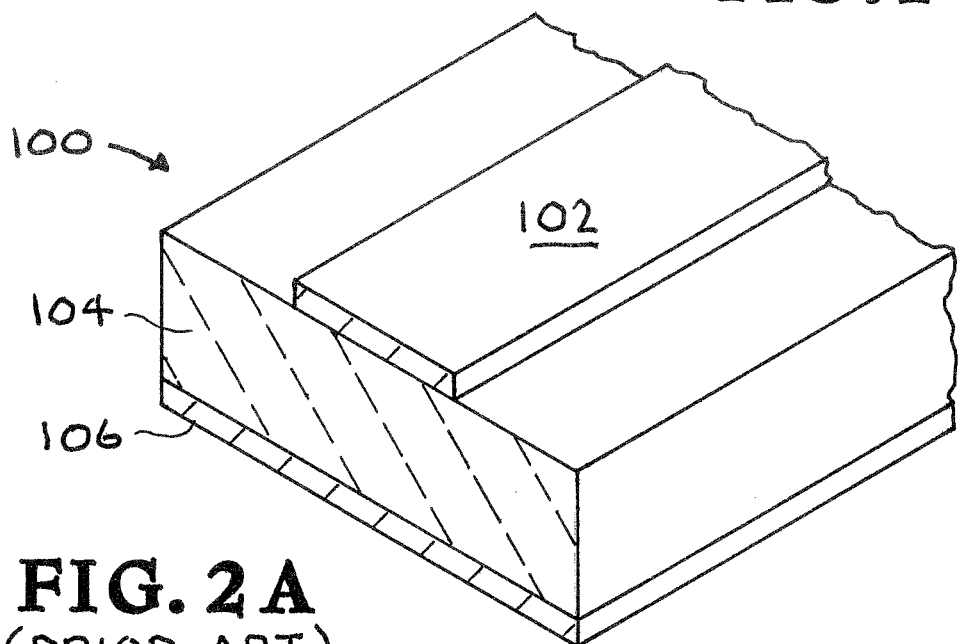
FIG. 2A is a perspective view of a prior art microstrip line structure in which the invention may be implemented.
Figure 2B:
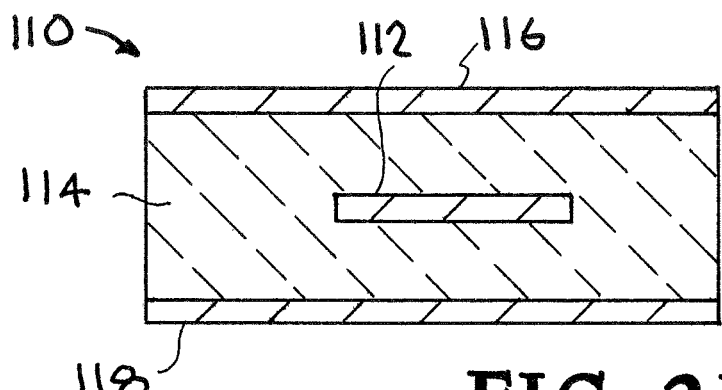
FIGS. 2B, C are cross-sectional views of prior art stripline and coplanar line (or waveguide) structures in which the invention may be implemented.
Figure 2C:
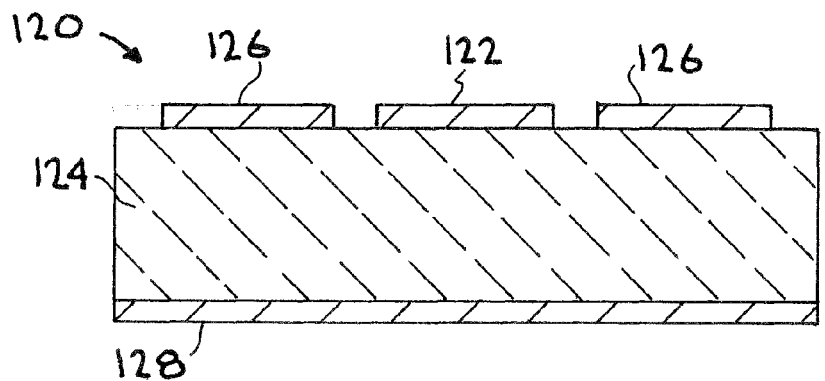

The circuit elements, including connecting lines and other components, can be formed of a variety of basic electrical structures, including microstrips, striplines and coplanar lines, which are illustrated in FIGS. 2A-C. As shown in FIG. 2A, a microstrip line structure 100 is formed of a conducting strip or trace 102 on a dielectric substrate 104 with a ground plane 106 on an opposed side. As shown in FIG. 2B, a stripline structure 110 is formed of a conducting strip or trace 112 in a dielectric substrate 114 with ground planes 116, 118 on opposed sides. As shown in FIG. 2C, a coplanar line (or waveguide) structure 120 is formed of a conducting strip or trace 122 on a dielectric substrate 124 with a pair of ground strips 126 around trace 122 on the same side and a ground plane 128 on an opposed side. The invention applies to circuits formed of these basic structures and any other structures having traces separated from ground planes.

Circuits are formed by patterning the traces 102, 112, 122 to define the various elements. The ground planes 106, 116, 118, 128 are at fixed distances from the traces 102, 112, 122, defined by the dimensions of dielectric substrates 104, 114, 124, while the circuit elements defined by the traces optimally require different distances. The impedance of each circuit element depends on the trace to ground plane distance. Impedance matching of circuit elements on circuits fabricated with structures such as structures 100, 110, 120 is therefore difficult. The invention addresses the problem by forming dielectric substrates 104, 114, 124 of multiple layers, with intermediate ground planes in various portions of the multilayer dielectric substrates to optimize the impedance of circuit elements.

Figure 3A:
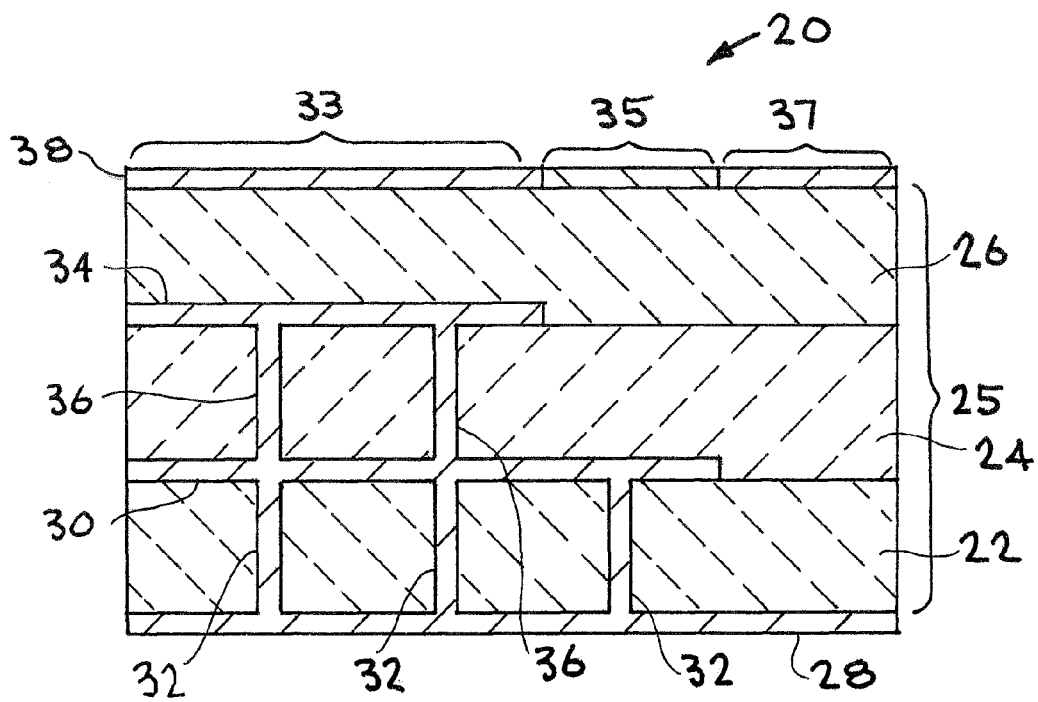
FIGS. 3A, B are a cross-sectional side view and an exploded side view of the impedance matching stepped ground plane structure of the invention.
Figure 3B:
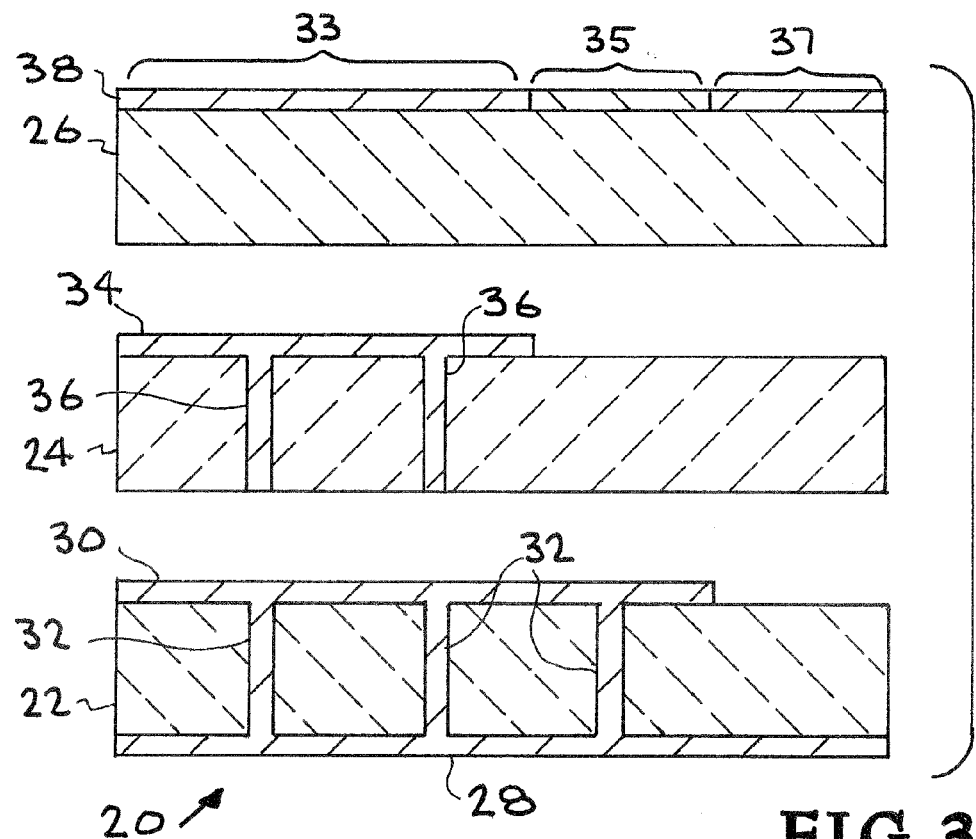

The basic structure of a stepped ground plane interconnect 20 of the invention is illustrated in FIGS. 3A, B. Interconnect 20 is formed of a multi-layer stack of substrates 22, 24, 26. While three layers are shown, any number can be used as desired. The layers 22, 24, 26 together form a composite dielectric layer 25, which corresponds to dielectric substrate 104, 114, 124 of FIGS. 2A-C, and forms the printed circuit board (PCB) on which the circuit is fabricated. A ground plane 28 is formed on the bottom surface of lower layer 22, and an intermediate ground plane 30 connected to base ground plane 28 by vias 32 through layer 22 is formed on a portion of the top surface of lower layer 22. Similarly, another intermediate ground plane 34 is formed on a smaller portion of the top surface of middle layer 24 and electrically connected to ground plane 30 by vias 36 through layer 24 and from there to base ground plane 28 by vias 32 through lower layer 22. Vias 36 are generally aligned with vias 32. A trace 38 is formed on the top surface of top layer 26. Because ground plane 30 is smaller than ground plane 28, and ground plane 34 is smaller than ground plane 30, interconnect 20 has a stepped ground plane structure.

In interconnect 20, trace 38 forms three connected circuit elements 33, 35, 37 over (aligned with) the underlying ground planes 34, 30, 28 (while three are shown, any number of circuit elements may be so formed). The circuit element 33, dielectric layer 26, and ground plane 34 form a microstrip line structure with characteristic impedance Z1. Similarly, circuit element 35, dielectric layer 26, dielectric layer 24, and ground plane 30 form another microstrip structure with characteristic impedance Z2. In the same manner, circuit element 37, dielectric layer 26, dielectric layer 24, dielectric layer 22, and ground plane 28 form a third microstrip structure with characteristic impedance Z3.

The impedance of each element is most affected by the ground plane immediately beneath it. Since each circuit element 33, 35, 37 is over a ground plane 34, 30, 28 that is the optimal distance for that element, its impedance Z1, Z2, Z3 can be selected to facilitate impedance matching of the circuit elements. The stepped ground plane structure enables this to be done while the circuit is fabricated on a PCB 25 of uniform thickness.

Figure 4:
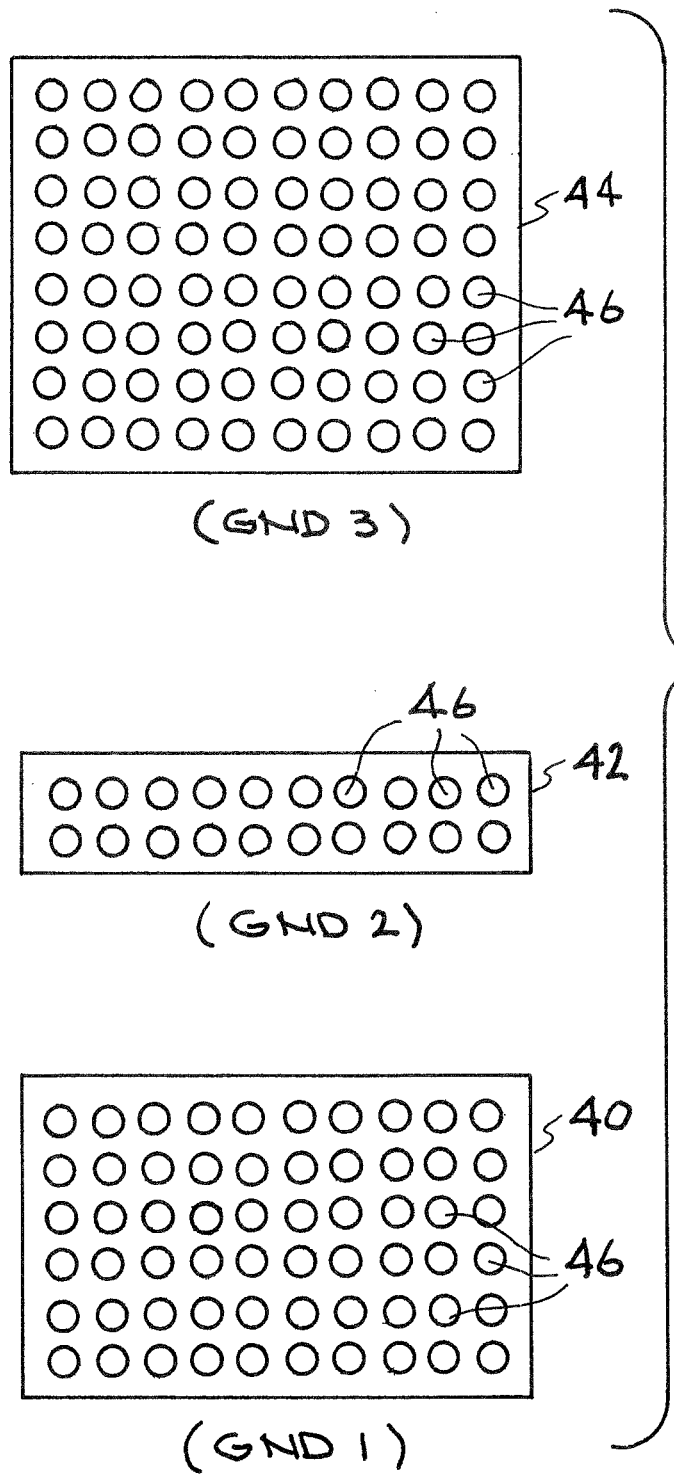
FIG. 4 is a top assembly view of the impedance matching stepped ground plane structure of the invention.

FIG. 4 shows three substrate layers 40, 42, 44 that can be arranged in a stack structure as shown in FIGS. 3A, B. Layers 40, 42, 44 have ground planes formed on at least portions thereof. The ground planes are electrically connected by a plurality of spaced vias 46. The number, diameter, and spacing (pitch) of the vias 46 can be selected to optimize performance. The pitch between vias should be less than $\lambda/16$ ($\lambda$=operational wavelength) because phase variation between vias should be less than 22.5 degrees. In general, the higher the frequency, the more important the via pitch and diameter. The via number depends on the operating wavelength, and the via pitch is less than a quarter of the wavelength. In an illustrative 94 GHz circuit, the via diameter is 3 mils and the pitch is 6 mils. At lower frequencies, standard vias are sufficient. Standard vias are those with dimensions typically used in high volume production runs with high yield processes. Those dimensions are usually well within the requirements for optimum performance at the lower frequencies.

Figure 5:
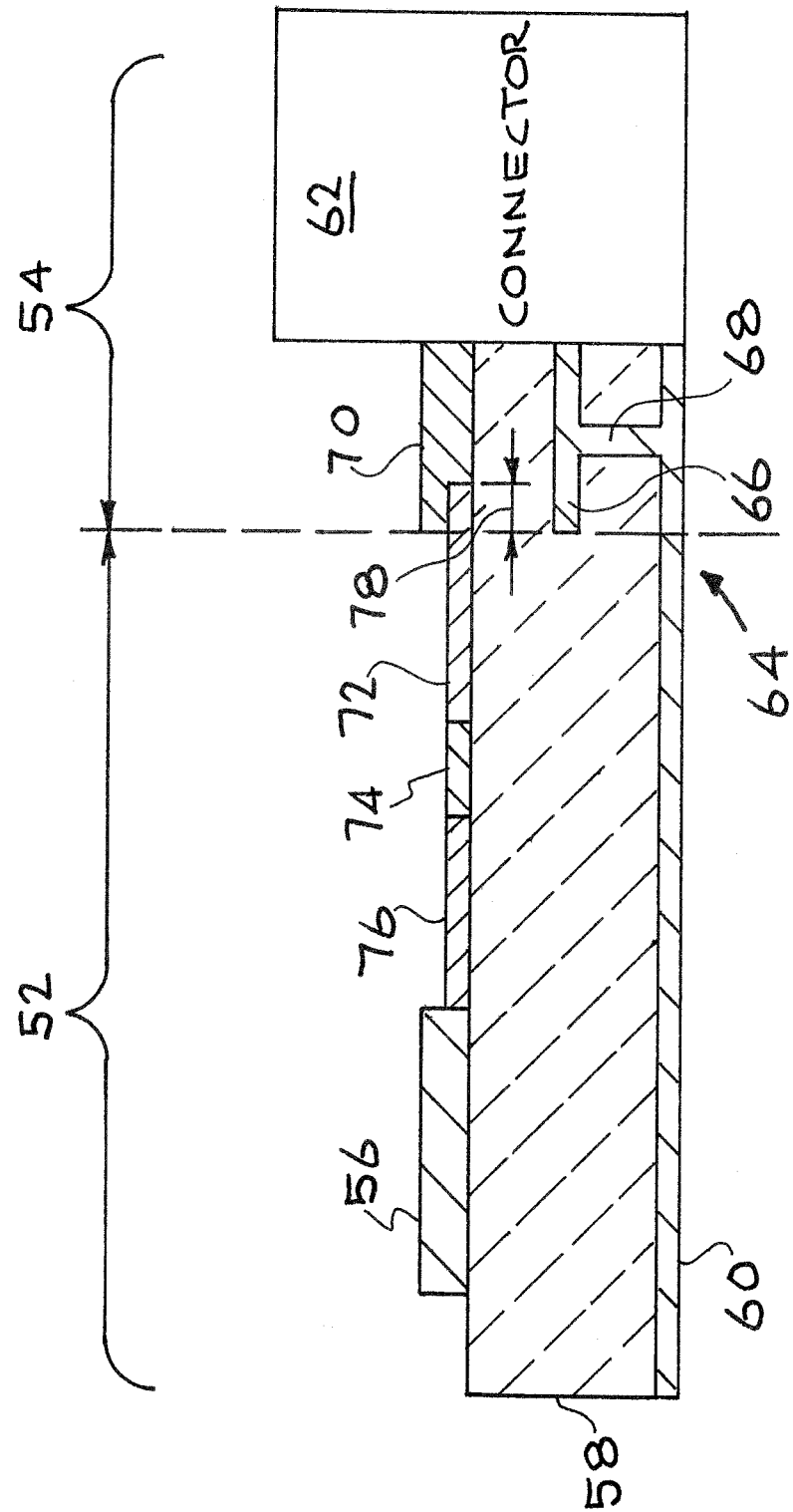
FIG. 5 illustrates a broadband interconnect of the invention between a patch antenna on a thick substrate connected to a microwave connector on a thinner substrate.

FIG. 5 illustrates a specific implementation of a broadband interconnect between a patch antenna on a thick substrate connected to a microwave connector on a thinner substrate. Electrical circuit 50 is divided into two regions 52, 54. In region 52, a printed broadband patch antenna 56 requires a substrate 58 of a particular thickness at the desired frequency of operation. The substrate 58 has a ground plane 60 on an opposed surface from patch antenna 56. The antenna 56 is energized by a connector 62 located in region 54. The connector-to-board interconnect 64 in region 54 requires a substantially thinner substrate to meet controlled impedance requirements of 50 Ohm interface to 50 Ohm connector. This is achieved by placing a second ground plane 66 in the interface 64. Ground plane 66 is above ground plane 60, e.g. between multiple layers of substrate 58 as in FIG. 3A and electrically connected thereto by vias 68. Thus the thickness of the underlying substrate between center pin 70 of connector 62 and ground plane 66 is much less than the thickness of antenna 56 to ground plane 60, meeting the electrical requirements of both parts of the circuit. Pin 70 electrically contacts 50 Ohm line segment 72 which extends from region 54 to region 52 on substrate 58. Line segment 72 is electrically connected to quarter wave transformer 74 that is electrically connected by conductor 76 to antenna 56. Thus power is supplied from connector 62 to antenna 56. Transformer 74 is used to connect elements of different impedance; since the impedances are different but the current is the same, the voltages are different so transformer 76 is used. The overlap of the 50 Ohm line segment 72 over ground plane 66 in region 78 provides reactive capacitive compensation to inductance introduced by the step in the ground plane.

Figure 6:
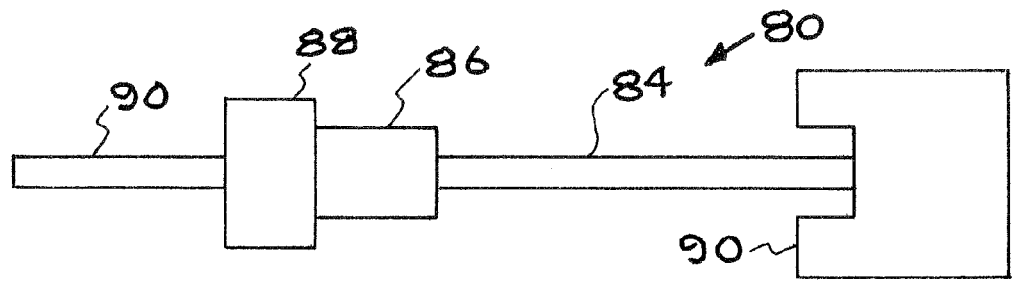
FIG. 6 is a top plan view of the patch antenna structure of FIG. 5.

FIG. 6 shows details of an illustrative embodiment of a patch antenna structure 80 fabricated on a PCB using the invention to provide interconnects. Patch antenna structure (circuit) 80 includes a patch antenna 82, which requires a thick substrate, and the following elements connected in series. Patch antenna 82 is connected to a microstrip line 84 with the impedance of patch antenna 82 on the thick substrate. The microstrip line 84 is connected to a quarter wave transformer 86 on the thick substrate. Transformer 86 is connected to a 50 Ohm microstrip line 88 on the thick substrate. Microstrip line 88 is connected to a 50 Ohm microstrip line 90 on a thin substrate. The circuit elements 82, 84, 86, 88, 90 of FIG. 6 correspond respectively to elements 56, 76, 74, 72, 78 of FIG. 5. An intermediate ground plane is formed under microstrip line 90 to produce the thinner substrate; the rest of the circuit is formed over the thicker substrate, i.e., no intermediate ground plane.

Figure 7:
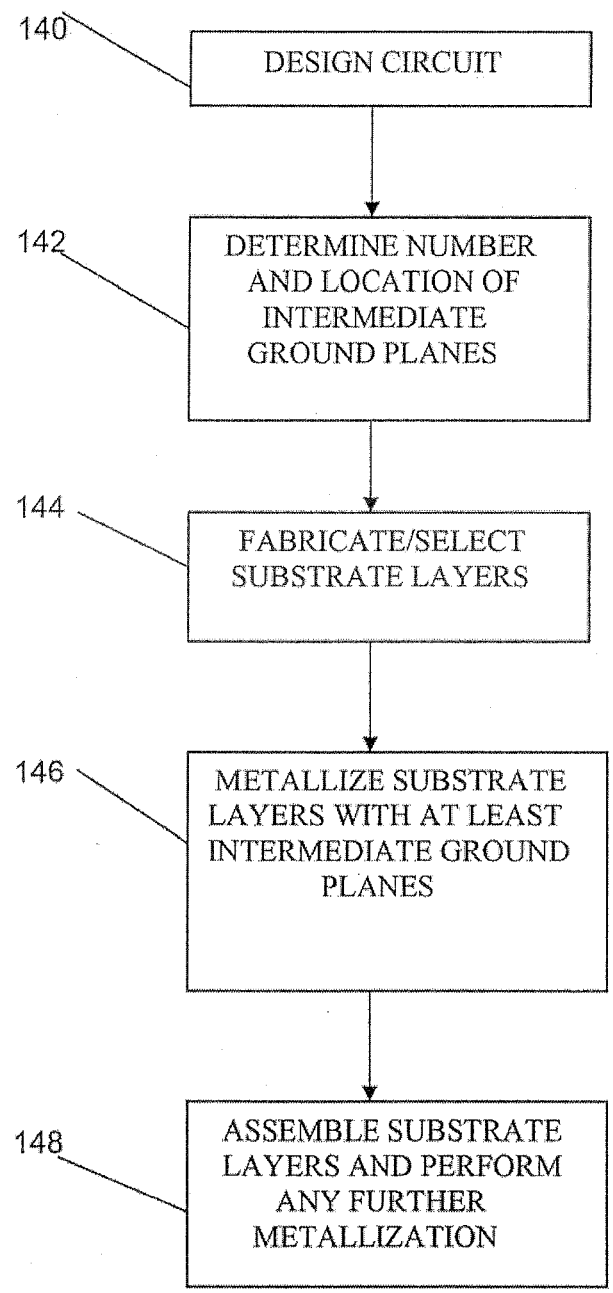
FIG. 7 is a flow chart of a method of fabricating the impedance matching stepped ground plane structure of the invention.

A method of fabricating the interconnect structures of the invention is shown in FIG. 7. First, in step 140, the circuit is designed, i.e. the conductive trace pattern that defines the circuit elements is determined. Once the circuit is designed, the substrate thicknesses for the various elements are designed, i.e. the number and location of any intermediate ground planes are determined, in step 142. The necessary substrate layers are then provided, e.g., fabricated or selected, in step 144. The parts of the circuit are then metallized, i.e., patterned trace, lower ground plane, intermediate ground planes and connecting vias, are formed on the appropriate substrate layers at the appropriate locations, in step 146. The metallized substrate layers are then assembled, e.g., bonded together, into the finished circuit, in step 148. The order of some steps may be varied. For example, in steps 146 and 148, only the intermediate ground planes and vias may be metallized before the substrate layers are bonded together to form the PCB, and then the trace and bottom ground plane metallized. Alternatively, the vias may be metallized after the layers are bonded. The invention is adaptable to specific materials and processes used in fabrication; materials and process capabilities vary between fabrication shops.

Figure 8:
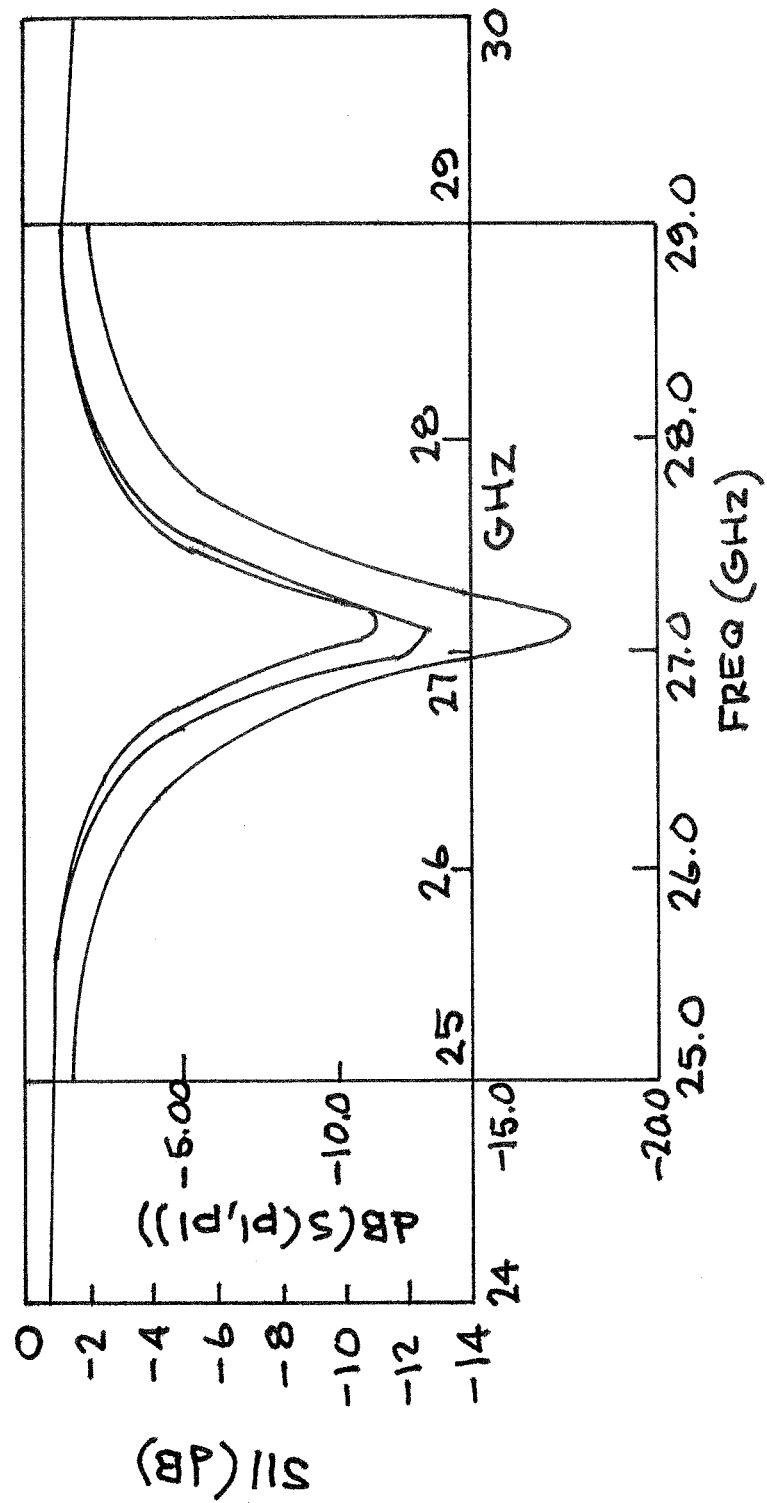
FIG. 8 is a graph of the simulated response of a patch antenna powered by a microwave connector through an interconnect of the invention.
Figure 9:
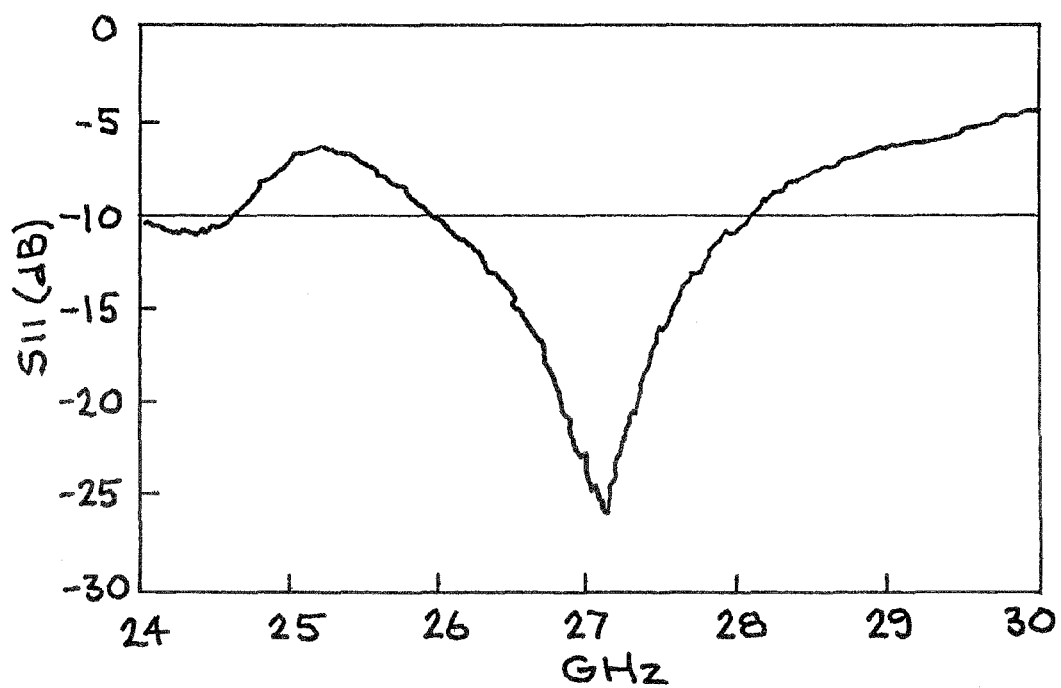
FIG. 9 is a graph showing the measured response of an exemplary patch antenna circuit simulated in FIG. 8.

Prior to fabrication, the circuit was simulated by the commercial electromagnetic full-wave analysis tool Ansoft HFSS. Results between measurement and simulation agree closely as shown in FIGS. 8 and 9. FIG. 9 is the measured response while FIG. 9 is the simulation.

The invention includes a method of making a broad band interconnect from an energizing coaxial cable/connector/board to a microwave device by incorporating a via-connected ground step in an intervening layer of a multilayer printed circuit board, and connecting the two ground planes. The method may further include providing impedance control compensation immediately above the ground step. More generally, the invention includes a method of making a broad band interconnect between circuit elements on a circuit board by incorporating a via-connected ground step in an intervening layer of a multilayer printed circuit board under a circuit element, and connecting the two ground planes. The method can be extended to include more than one intermediate ground plane on more than one intervening layer of the circuit board.

The invention thus provides broadband electrical interconnect between board areas containing varying heights in surface-to-ground plane (return path) location. The invention applies to any broadband circuit formed of patterned conductive traces separated from a ground plane by a dielectric layer, including microstrip, stripline, and coplanar line structures. The invention has particular uses in the mobile wireless markets where a small number of broadband path radiators, necessarily on thick substrates are interconnected to RF feeding networks requiring thinner substrates for impedance control.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A microwave or millimeter wave circuit, comprising:
    a multi-layered dielectric substrate;
    a conductive trace formed on one surface of the substrate, the trace being patterned to define circuit elements and transmission lines;
    a base ground plane formed on the opposed surface of the substrate;
    an intermediate ground plane formed on a layer of the substrate below a circuit element or transmission line; and
    vias connecting the intermediate ground plane to the base ground plane to from a stepped ground plane structure, wherein the intermediate ground plane is positioned to control the impedance of the overlying circuit element or transmission line;
    wherein the trace comprises a microwave patch antenna, a transmission line for connecting the patch antenna to an energizing coaxial cable, and a quarter wave transformer between the transmission line and the patch antenna.

2. The circuit of claim 1, wherein the trace is a microstrip.

3. The circuit of claim 1, wherein the trace is a stripline or coplanar line.

4. The circuit of claim 1, further comprising additional intermediate ground planes on substrate layers under circuit elements or transmission lines, and vias connecting the additional intermediate ground planes to the base ground plane.

5. The circuit of claim 1, wherein the via number, diameter and pitch are functions of the circuit operating frequency.

6. A method of constructing microwave and other high frequency electrical circuits on a substrate of uniform thickness, where the circuit is formed of a plurality of interconnected elements of different impedances that individually require substrates of different thicknesses, the method comprising:
    providing a substrate of uniform thickness that is a composite or multilayered substrate; and
    forming a pattern of intermediate ground planes or impedance matching steps interconnected by vias located under various parts of the circuit where components of different impedances are located so that each part of the circuit has a ground plane substrate thickness that is optimum while the entire circuit is formed on a substrate of uniform thickness;
    wherein the circuit comprises a microwave patch antenna, a transmission line for connecting the patch antenna to an energizing coaxial cable, and a quarter wave transformer between the transmission line and the patch antenna.

7. The method of claim 6, wherein the intermediate ground planes are formed on layers of the multilayered substrate and connected to a base ground plane on the substrate.

8. The method of claim 6, wherein the circuit elements are formed by patterning a conductive trace on the substrate.

9. The method of claim 8, wherein the circuit elements are formed by patterning a microstrip.

10. The method of claim 8, wherein the circuit elements are formed by patterning a stripline or coplanar line.

11. The method of claim 8, wherein the conductive trace is patterned to form the patch antenna, the quarter wave transformer, and the transmission line, and a ground plane step is formed under the transmission line.

* * * * *